(12) United States Patent
Ke et al.

(10) Patent No.: US 9,508,827 B2
(45) Date of Patent: Nov. 29, 2016

(54) METHOD FOR FABRICATING SEMICONDUCTOR DEVICE

(71) Applicant: UNITED MICROELECTRONICS CORP., Hsin-Chu (TW)

(72) Inventors: Jian-Cun Ke, Tainan (TW); Chih-Wei Yang, Kaohsiung (TW); Chia-Fu Hsu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 9 days.

(21) Appl. No.: 14/918,583

(22) Filed: Oct. 21, 2015

(65) Prior Publication Data

US 2016/0049497 A1 Feb. 18, 2016

Related U.S. Application Data

(62) Division of application No. 14/275,858, filed on May 12, 2014, now Pat. No. 9,196,726.

(30) Foreign Application Priority Data

Apr. 8, 2014 (CN) .......................... 2014 1 0138718

(51) Int. Cl.
| | | |
|---|---|---|
| *H01L 21/782* | (2006.01) | |
| *H01L 29/66* | (2006.01) | |
| *H01L 29/78* | (2006.01) | |
| *H01L 29/51* | (2006.01) | |
| *H01L 29/49* | (2006.01) | |
| *H01L 21/265* | (2006.01) | |
| *H01L 21/02* | (2006.01) | |
| *H01L 21/28* | (2006.01) | |
| *H01L 21/3115* | (2006.01) | |

(52) U.S. Cl.
CPC ... *H01L 29/66575* (2013.01); *H01L 21/02532* (2013.01); *H01L 21/265* (2013.01); *H01L 21/26506* (2013.01); *H01L 21/26513* (2013.01); *H01L 21/26586* (2013.01); *H01L 21/28088* (2013.01); *H01L 21/31155* (2013.01); *H01L 29/4925* (2013.01); *H01L 29/4966* (2013.01); *H01L 29/512* (2013.01); *H01L 29/513* (2013.01); *H01L 29/517* (2013.01); *H01L 29/66545* (2013.01); *H01L 29/7833* (2013.01)

(58) Field of Classification Search
CPC ....... H01L 21/82; H01L 29/78; H01L 29/66; H01L 29/51; H01L 21/02; H01L 21/265
USPC .......................................... 438/128
See application file for complete search history.

(56) References Cited

U.S. PATENT DOCUMENTS

| | | | |
|---|---|---|---|
| 5,750,435 A * | 5/1998 | Pan ............... | H01L 21/26586 257/E21.194 |
| 5,885,886 A * | 3/1999 | Lee ............... | H01L 21/26506 257/E21.335 |
| 6,764,898 B1 | 7/2004 | En et al. | |
| 7,867,839 B2 | 1/2011 | Chen et al. | |
| 2002/0012883 A1 | 1/2002 | Kung | |
| 2004/0201067 A1* | 10/2004 | Shih ............... | H01L 21/26586 257/408 |

(Continued)

*Primary Examiner* — Phuc Dang
(74) *Attorney, Agent, or Firm* — Winston Hsu; Scott Margo

(57) ABSTRACT

A method for fabricating semiconductor device is disclosed. The method includes the steps of: providing a substrate; forming a gate structure on the substrate; forming a lightly doped drain in the substrate; and performing a first implantation process for implanting fluorine ions at a tiled angle into the substrate and part of the gate structure.

13 Claims, 4 Drawing Sheets

(56) References Cited

U.S. PATENT DOCUMENTS

| | | |
|---|---|---|
| 2004/0203246 A1 | 10/2004 | Kamath |
| 2005/0236618 A1 | 10/2005 | Toyoda |
| 2010/0155795 A1* | 6/2010 | Cho .................. H01L 21/26513 257/288 |
| 2010/0233864 A1* | 9/2010 | Lee .................... H01L 21/2236 438/306 |
| 2011/0169082 A1 | 7/2011 | Zhu |
| 2012/0015503 A1* | 1/2012 | Yao .................. H01L 21/26506 438/478 |
| 2013/0330900 A1* | 12/2013 | Pandey ................ H01L 21/265 438/301 |
| 2014/0264589 A1 | 9/2014 | Chang |
| 2015/0129973 A1 | 5/2015 | Ji |
| 2015/0221663 A1* | 8/2015 | Tan .................. H01L 29/42324 257/300 |

* cited by examiner

METHOD FOR FABRICATING SEMICONDUCTOR DEVICE

CROSS REFERENCE TO RELATED APPLICATIONS

This application is a division of U.S. application Ser. No. 14/275,858 filed May 12, 2014 U.S. Pat. No. 9,196,726, and incorporated herein by reference in its entirety.

BACKGROUND OF THE INVENTION

1. Field of the Invention

The invention relates to a method for fabricating semiconductor device, and more particularly, to a method of using ion implantations to form interface layer in a gate structure.

2. Description of the Prior Art

In current semiconductor industry, polysilicon has been widely used as a gap-filling material for fabricating gate electrode of metal-oxide-semiconductor (MOS) transistors. However, the conventional polysilicon gate also faced problems such as inferior performance due to boron penetration and unavoidable depletion effect which increases equivalent thickness of gate dielectric layer, reduces gate capacitance, and worsens driving force of the devices. In replacing polysilicon gates, work function metals have been developed to serve as a control electrode working in conjunction with high-K gate dielectric layers.

Nevertheless, as semiconductor technology advances, gate structures employing work function materials soon reaches their physical and electrical limitation, causing side-effects including electrical instability and negative bias temperature instability (NBTI) effect.

NBTI effect is typically caused by accumulation of electrical potentials between silicon substrate and silicon oxide layers, which induces an effect when gate electrode is negatively biased. As PMOS transistors apply negative bias to generate electrons on metal gate adjacent to gate oxide, reject electrons on n-type substrate, and generate electron holes on n-type substrate and electron hole channel under gate structure thereby inducing electron holes of the source/drain region to be transmitted through this channel, NBTI effect is especially influential in CMOS devices containing PMOS structures.

SUMMARY OF THE INVENTION

It is therefore an objective of the present invention to provide a method of fabricating semiconductor device for improving issues caused by NBTI in current process.

According to a preferred embodiment of the present invention, a method for fabricating semiconductor device is disclosed. The method includes the steps of: providing a substrate; forming a gate structure on the substrate; forming a lightly doped drain in the substrate; and performing a first implantation process for implanting fluorine ions at a tiled angle into the substrate and part of the gate structure.

According to another aspect of the present invention, a semiconductor device is disclosed. The semiconductor device includes a substrate, a gate structure on the substrate, and a source/drain region in the substrate adjacent to the gate structure. The gate structure includes a first interface layer on the substrate, an interfacial layer on the first interface layer, and a conductive layer on the interfacial layer. Preferably, the first interface layer includes a first region and a second region surrounding the first region, and the concentration of the second region is higher than the concentration of the first region.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
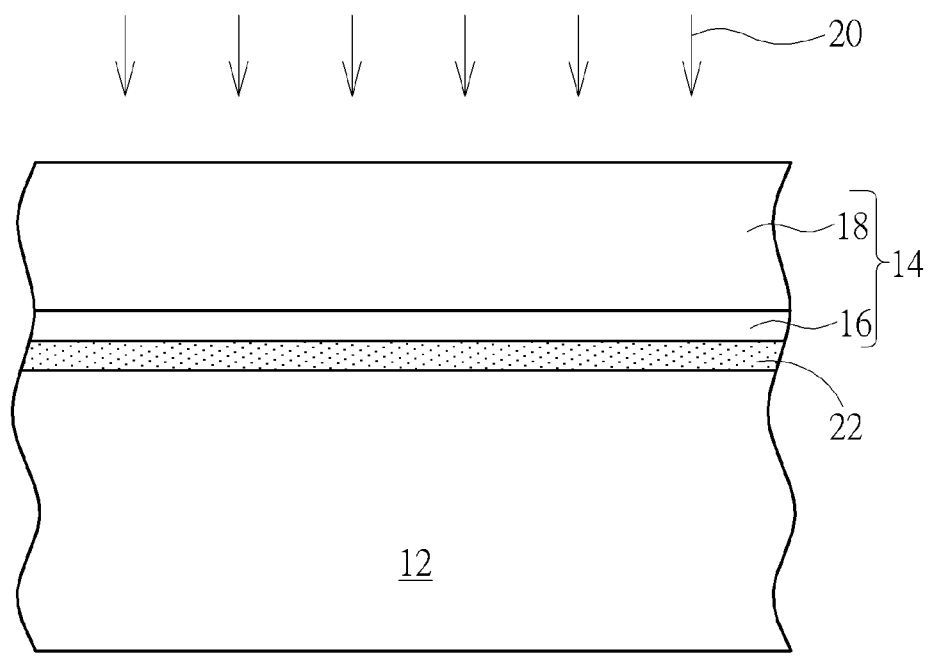
FIGS. 1-4 illustrate a method for fabricating semiconductor device according to a first embodiment of the present invention.

Referring to FIGS. 1-4, FIGS. 1-4 illustrate a method for fabricating semiconductor device according to a first embodiment of the present invention. As shown in FIG. 1, a substrate 12, such as a wafer or silicon-on-insulator (SOI) substrate is provided. A stack structure 14 is then formed on the substrate 12, in which the stack structure 14 may be fabricated by first forming an interfacial layer 16 on the substrate 12 and then forming a sacrificial layer 18 on the interfacial layer 16. In this embodiment, the interfacial layer 16 is preferably composed of silicon material such as silicon dioxide ($SiO_2$), silicon nitride (SiN), silicon oxynitride (SiON), or other dielectric material with high permittivity or dielectric constant. The sacrificial layer 18 is preferably composed of single crystal silicon, doped polysilicon, or amorphous polysilicon, but could also be composed material selected from silicides or other metal material.

According to an embodiment of the present invention, a hard mask (not shown) could be selectively formed on the surface of the sacrificial layer 18 after the formation of the sacrificial layer 18, in which the hard mask could be selected from the group consisting of SiC, SiON, SiN, SiCN and SiBN, but not limited thereto. Since the hard mask is a selectively formed element, it will be omitted in the following embodiment for the sake of brevity.

Next, an implantation process 20 is conducted to implant fluorine ions into an interface between the interfacial layer 16 and the substrate 12. This forms an interface layer 22 between the substrate 12 and the interfacial layer 16.

Figure 2:
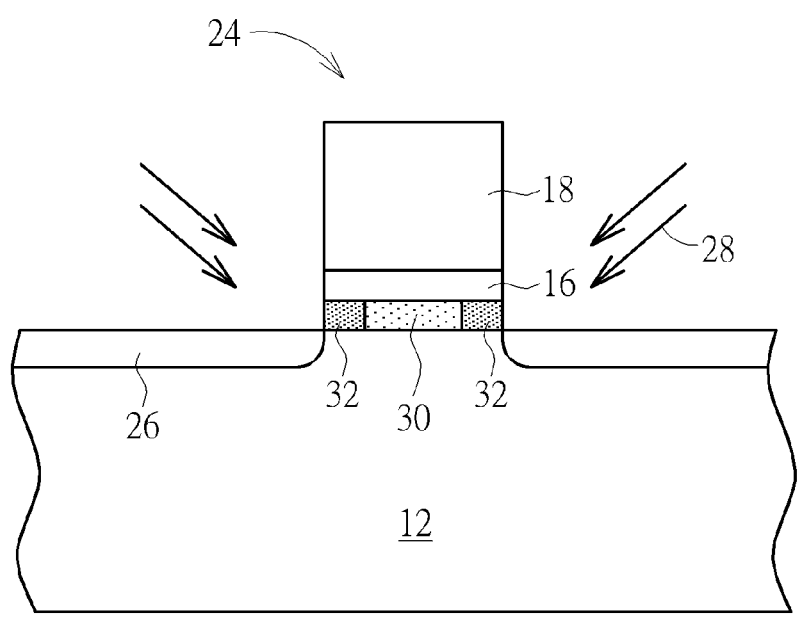

Next, as shown in FIG. 2, a patterned mask, such as a patterned resist (not shown) is formed on the sacrificial layer 18, and a pattern transfer process is conducted by using the patterned resist as mask through single or multiple etching processes to remove part of the sacrificial layer, interfacial layer, and interface layer not covered by the patterned resist for forming a gate structure 24. In other words, the gate structure 24 preferably includes a patterned interfacial layer 16, a patterned interface layer 22, and a patterned sacrificial layer 18.

Next, a1 liner (not shown) could be selectively formed on the sidewall of the gate structure 24, and a lightly doped implantation process is conducted to forma lightly doped drain 26 in the substrate 12 adjacent to two sides of the liner or the gate structure 24. Preferably, the dopants implanted during the lightly doped implantation process are adjusted according to the type of transistor being fabricated. For instance, if a NMOS transistor were to be fabricated, n-type dopants are implanted into the substrate 12 whereas if a PMOS transistor were to be fabricated, p-type dopants are implanted into the substrate 12.

After forming the lightly doped drain 26, another implantation process 28 is conducted to implant fluorine ions at a tilted angle into the substrate 12 and part of the gate structure 24. In this embodiment, the concentration of the fluorine ions implanted during the implantation process 28 is substantially the same as the concentration of the fluorine ions implanted during the implantation process 20, but not limited thereto. For instance, the concentration of the fluorine ions implanted during the implantation process 28 could also be higher or lower than the concentration of fluorine ions implanted during the implantation process 20 depending on the demand of the product, which are all within the scope of the present invention.

It should be noted that since the implantation process 28 is conducted at a tilted angle so that some of the fluorine ions implanted during implantation process 28 would overlap some of the fluorine ions implanted during the previous implantation process 20, a first region 30 and a second region 32 surrounding the first region 30 are preferably formed in the interface layer 22 between the substrate 12 and the interfacial layer 16 after the implantation process 28. Moreover, as the second region 32 includes fluorine ions implanted from both implantation processes 20 and 28 while the first region 30 only includes fluorine ions implanted from a single implantation process, the concentration of fluorine ions in the second region 32 is preferably higher than the concentration of fluorine ions in the first region 30. It should also be noted that even though the first region 30 and the second region 32 appeared to have a rectangular shaped cross-section, the present invention could also adjust the boundary and position of ion implantation to form a substantially triangular cross-section for the second region 32 and a substantially trapezoid cross-section for the first region 30 in the interface layer 22 according to the demand of the product, and in such instance the concentration of fluorine ions in the second region 32 would also be higher than the concentration of fluorine ions in the first region 30.

Figure 3:
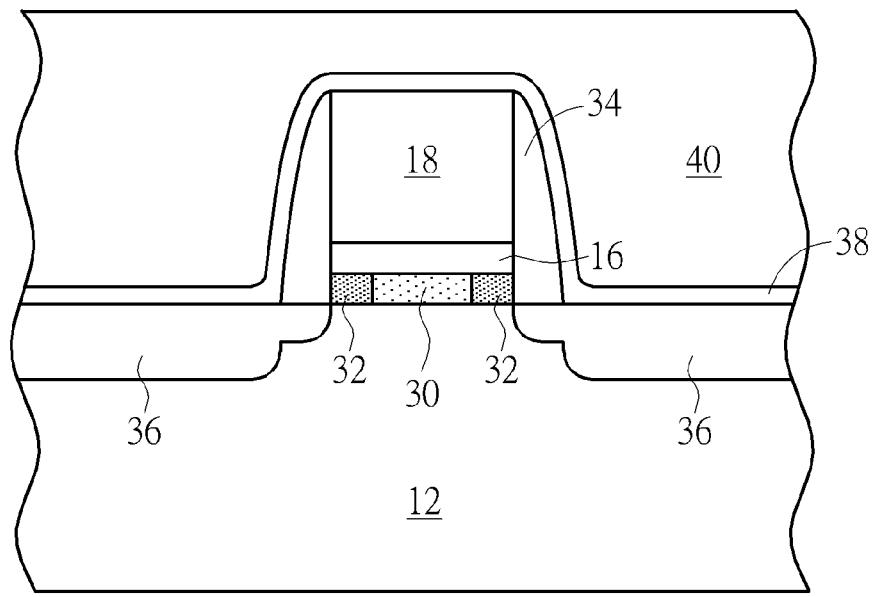

Next, as shown in FIG. 3, a spacer 34 is formed on the sidewall of the gate structure 24, and a source/drain region 36 is formed in the substrate 12 adjacent to two sides of the spacer 34. In this embodiment, the formation of the spacer 34 could include formation of an offset spacer and a main spacer, and despite the spacer 34 is formed after the implantation process 28, an embodiment involving an order of first forming an offset spacer on the sidewall of the gate structure 24, conducting the implantation process 28 to form the aforementioned first region 30 and second region 32, and then forming a main spacer on the sidewall of the offset spacer could also be employed according to the demand of the product, which is also within the scope of the present invention. Next, a contact etch stop layer (CESL) 38 is formed on the gate structure 24, and an interlayer dielectric (ILD) layer 40 is formed on the CESL 38. It should be noted that elements including epitaxial layer and silicides could also be formed before the deposition of the CESL 38 according to the demand of the product, and as the fabrication of these elements are well known to those skilled in the art, the details of which are not explained herein for the sake of brevity. In addition, if the sacrificial layer 18 in the gate structure 24 were composed of metal material, a fabrication of MOS transistor could be completed at this stage.

Figure 4:
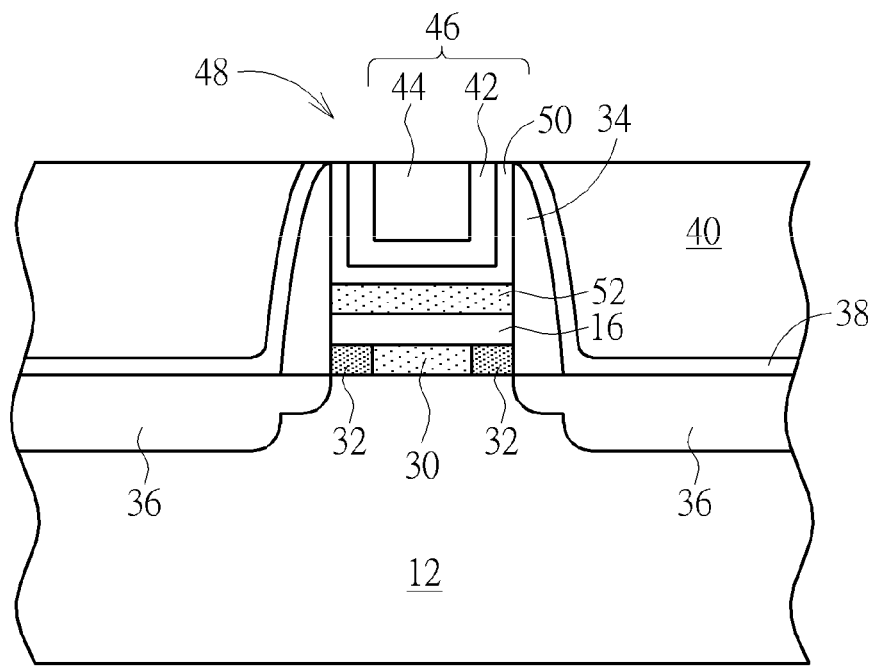

Next, a replacement metal gate (RMG) process could be selectively conducted along with a high-k last process to transform the gate structure 24 into a metal gate. As shown in FIG. 4, the RMG process could be accomplished by first using a planarizing process to partially remove the ILD layer 40 and the CESL 38 to expose the surface of the sacrificial layer 18 of the gate structure 24, and then performing a selective dry etching or wet etching process, such as using etchants including ammonium hydroxide ($NH_4OH$) or tetramethylammonium hydroxide (TMAH) to remove the sacrificial layer 18 from the gate structure 24 for forming a recess (not shown). Next, a U-shaped high-k dielectric layer 50 and a conductive layer 46 including a work function metal layer 42 and low resistance metal layer 44 is deposited into the recess, and another planarizing process is conducted thereafter to form a metal gate 48.

In this embodiment, the work function metal layer 42 is formed for tuning the work function of the metal gate 48 so that the device could be adapted in an NMOS or a PMOS transistor. For an NMOS transistor, the work function metal layer 42 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but is not limited thereto. For a PMOS transistor, the work function metal layer 42 having a work function ranging between 4.8 eV and 5.2 eV may include titanium nitride (TiN), tantalum nitride (TaN), tantalum carbide (TaC), but is not limited thereto. A barrier layer (not shown) could be formed between the work function metal layer 42 and the low resistance metal layer 44, in which the material of the barrier layer may include titanium (Ti), titanium nitride (TiN), tantalum (Ta) or tantalum nitride (TaN). Furthermore, the material of the low resistance metal layer 44 may include copper (Cu), aluminum (Al), titanium aluminum (TiAl), cobalt tungsten phosphide (CoWP) or any combination thereof.

According to an embodiment of the present invention, as shown in FIG. 4, another implantation could be selectively conducted after forming the high-k dielectric layer 50 to implant fluorine ions into an interface between the high-k dielectric layer 50 and interfacial layer 16 for forming another interface layer 52. After forming the interface layer 52, the conductive layer 46 containing both the work function metal layer 42 and low resistance metal layer 44 could be formed thereafter.

Figure 5:
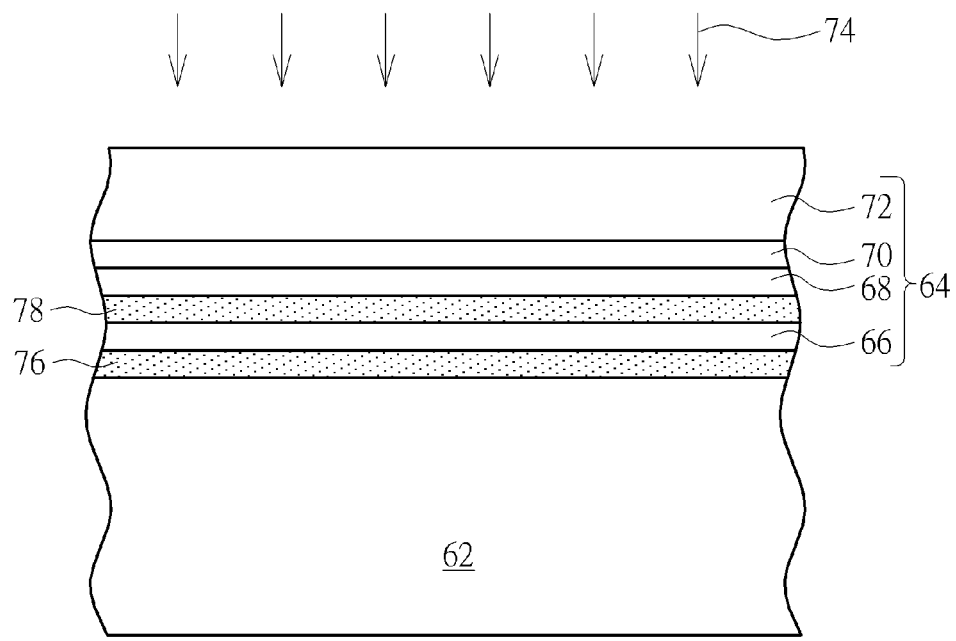
FIGS. 5-8 illustrate a method for fabricating semiconductor device according to a second embodiment of the present invention.

Referring to FIGS. 5-8, FIGS. 5-8 illustrate a method for fabricating semiconductor device according to a second embodiment of the present invention. As shown in FIG. 5, a substrate 62, such as a wafer or silicon-on-insulator (SOI) substrate is provided. A stack structure 64 is then formed on the substrate 62, in which the stack structure 64 may be fabricated by sequentially forming an interfacial layer 66, a high-k dielectric layer 68, a bottom barrier metal (BBM) layer 70, and a sacrificial layer 72 on the substrate 62.

In this embodiment, the interfacial layer 66 is preferably composed of silicon material such as silicon dioxide ($SiO_2$), silicon nitride (SiN), or silicon oxynitride (SiON), or other dielectric material with high permittivity or dielectric constant. The sacrificial layer 72 is preferably composed of single crystal silicon, doped polysilicon, or amorphous polysilicon, but could also be composed material selected from silicides or other metal material.

As the present embodiment is preferably accomplished by the employment of a high-k first process from gate last process, the high-k dielectric layer 68 preferably has a "I-shaped" cross section and preferably be selected from dielectric materials having dielectric constant (k value) larger than 4. For instance, the high-k dielectric layer 68 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the high-k dielectric layer 68 may be formed by atomic layer deposition (ALD) process or metal-organic chemical vapor deposition (MOCVD) process, but not limited thereto.

Similar to the first embodiment, a hard mask (not shown) could be selectively formed on the surface of the sacrificial layer 72 after the formation of the sacrificial layer 72, in which the hard mask could be selected from the group consisting of SiC, SiON, SiN, SiCN and SiBN, but not limited thereto. Since the hard mask is a selectively formed element, it will be omitted in the following embodiment for the sake of brevity.

Next, an implantation process 74 is conducted to implant fluorine ions entirely into the stack structure 64. This forms a first interface layer 76 between the substrate 62 and the interfacial layer 66 and a second interface layer 78 between the interfacial layer 66 and the high-k dielectric layer 68.

Figure 6:
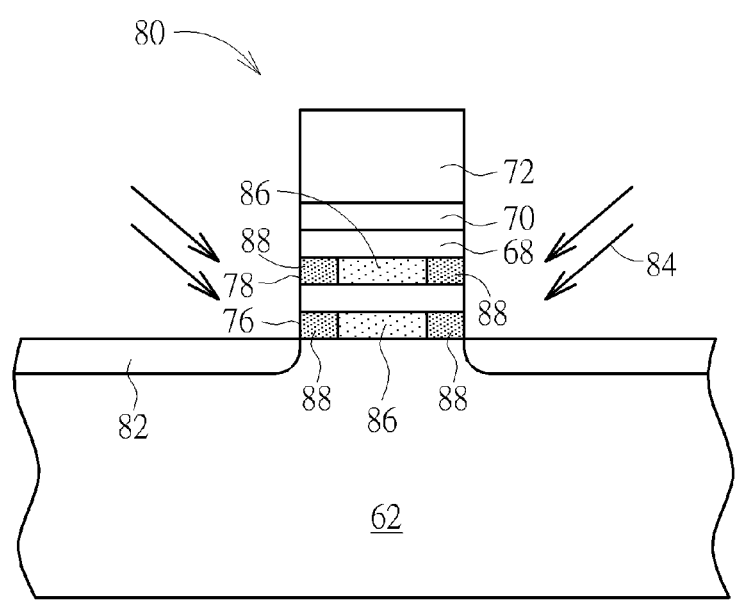

Next, as shown in FIG. 6, a patterned mask, such as a patterned resist (not shown) is formed on the sacrificial layer 72, and a pattern transfer process is conducted by using the patterned resist as mask through single or multiple etching processes to remove part of the sacrificial layer 72, BBM layer 70, high-k dielectric layer 68, second interface layer 78, interfacial layer 66, and first interface layer 76 not covered by the patterned resist for forming a gate structure 80. In other words, the gate structure 80 preferably includes a patterned first interface layer 76, patterned interfacial layer 66, patterned second interface layer 78, patterned high-k dielectric layer 68, patterned BBM layer 70, and patterned sacrificial layer 72.

Next, a1 liner (not shown) could be selectively formed on the sidewall of the gate structure 80, and a lightly doped implantation process is conducted to form a lightly doped drain 82 in the substrate 62 adjacent to two sides of the liner or the gate structure 80. Preferably, the dopants implanted during the lightly doped implantation process are adjusted according to the type of transistor being fabricated. For instance, if a NMOS transistor were to be fabricated, n-type dopants are implanted into the substrate 62 whereas if a PMOS transistor were to be fabricated, p-type dopants are implanted into the substrate 62.

After forming the lightly doped drain 82, another implantation process 84 is conducted to implant fluorine ions at a tilted angle into the substrate 62 and part of the gate structure 80. Similar to the first embodiment, the concentration of the fluorine ions implanted during the implantation process 84 is substantially the same as the concentration of the fluorine ions implanted during the implantation process 74, but not limited thereto. For instance, the concentration of the fluorine ions implanted during the implantation process 84 could also be higher or lower than the concentration of fluorine ions implanted during the implantation process 74 depending on the demand of the product, which are all within the scope of the present invention.

It should be noted that since the implantation process 84 is conducted at a tilted angle so that some of the fluorine ions implanted during implantation process 84 would overlap some of the fluorine ions implanted during the previous implantation process 74, a first region 86 and a second region 88 surrounding the first region 86 are preferably formed in the first interface layer 76 between the substrate 62 and the interfacial layer 66 and the second interface layer 78 between the interfacial layer 66 and the high-k dielectric layer 68. Moreover, as the second region 88 includes fluorine ions implanted from both implantation processes 74 and 84 while the first region 86 only includes fluorine ions implanted from the first implantation process 74, the concentration of fluorine ions in the second region 88 is preferably higher than the concentration of fluorine ions in the first region 86. It should also be noted that even though the first region 86 and the second region 88 appeared to have a rectangular shaped cross-section, the present invention could also adjust the boundary and position of ion implantation to form a substantially triangular cross-section for the second region 88 and a substantially trapezoid cross-section for the first region 86 in the first interface layer 76 and second interface layer 78 according to the demand of the product, and in such instance the concentration of fluorine ions in the second region 88 would also be higher than the concentration of fluorine ions in the first region 86.

Figure 7:
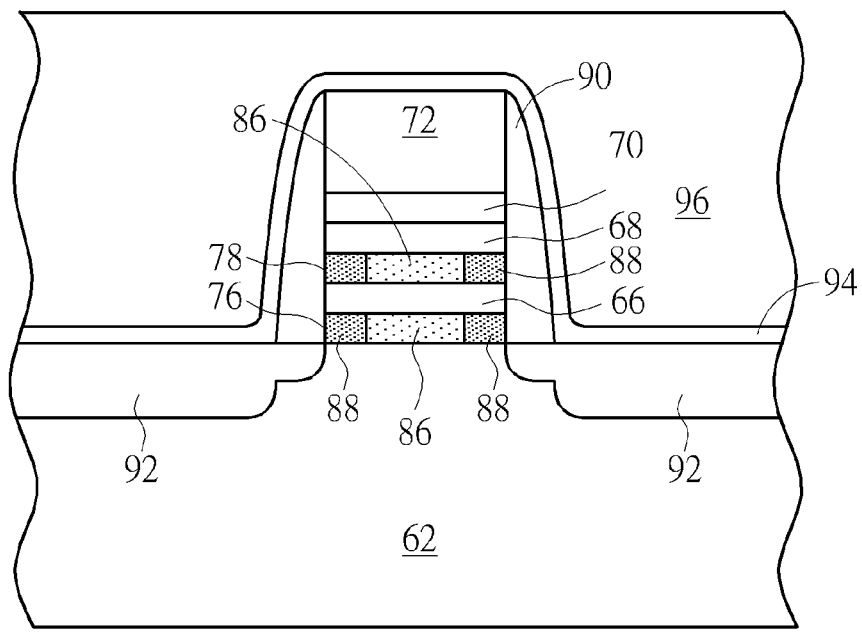

Next, as shown in FIG. 7, a spacer 90 is formed on the sidewall of the gate structure 80, and a source/drain region 92 is formed in the substrate 62 adjacent to two sides of the spacer 90. Similar to the first embodiment, the formation of the spacer 90 could include formation of an offset spacer and a main spacer, and despite the spacer is formed after the implantation process 84, an embodiment involving an order of first forming an offset spacer on the sidewall of the gate structure 80, conducting the implantation process 84 to form the aforementioned first region 86 and second region 88, and then forming a main spacer on the sidewall of the offset spacer could also be employed according to the demand of the product, which is also within the scope of the present invention. Next, a contact etch stop layer (CESL) 94 is formed on the gate structure 80, and an interlayer dielectric (ILD) layer 96 is formed on the CESL 94. It should be noted that elements including epitaxial layer and silicides could also be formed before the deposition of the CESL 94 according to the demand of the product, and as the fabrication of these elements are well known to those skilled in the art, the details of which are not explained herein for the sake of brevity.

Figure 8:
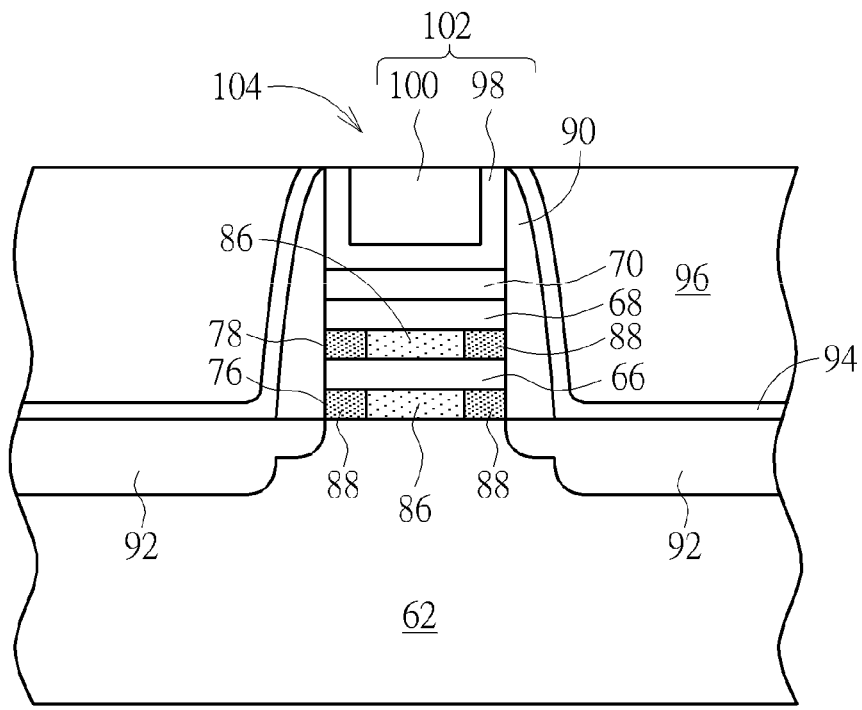

Next, a replacement metal gate (RMG) process could be conducted to transform the gate structure 80 into a metal gate. As shown in FIG. 8, the RMG process could be accomplished by performing a selective dry etching or wet etching process, such as using etchants including ammonium hydroxide ($NH_4OH$) or tetramethylammonium hydroxide (TMAH) to remove the sacrificial layer 72 from the gate structure 80 for forming a recess (not shown). Next, a conductive layer 102 including a U-shaped work function metal layer 98 and low resistance metal layer 100 is deposited into the recess, and another planarizing process is conducted thereafter to form a metal gate 104.

In this embodiment, the work function metal layer 98 is formed for tuning the work function of the metal gate 104 so that the device could be adapted in an NMOS or a PMOS transistor. For an NMOS transistor, the work function metal layer 98 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but is not limited thereto. For a PMOS transistor, the work function metal layer 98 having a work function ranging between 4.8 eV and 5.2 eV may include titanium nitride (TiN), tantalum nitride (TaN), tantalum carbide (TaC), but is not limited thereto. A barrier layer (not shown) could be formed between the work function metal layer 98 and the low resistance metal layer 100, in which the material of the barrier layer may include titanium (Ti), titanium nitride (TiN), tantalum (Ta) or tantalum nitride (TaN). Furthermore, the material of the low resistance metal layer 100 may include copper (Cu), aluminum (Al), tungsten (W), titanium aluminum (TiAl), cobalt tungsten phosphide (CoWP) or any combination thereof.

Overall, the present invention preferably conducts two ion implantation processes to inject fluorine ions into a gate structure before and after forming the gate structure on a substrate. The first implantation process is preferably conducted to implant fluorine ions into the stack structure entirely before forming the gate structure whereas the second implantation process is conducted to implant fluorine ions at a tilted angle into the gate structure after the gate structure is formed. Preferably, the two implantation processes are carried out to form a first region and a second region surrounding the first region in a first interface layer between substrate and interfacial layer and a second interface layer between interfacial layer and high-k dielectric layer, in which the concentration of the fluorine ions in the second region is substantially higher than the concentration of fluorine ions in the first region.

Typically, the bond strength of Si—O bond and Si—H bond between material layers such as substrate, interfacial layer, and high-k dielectric layer is around 3.18 eV (taking Si—H bond as an example) or 4.8 eV (taking Si—O bond as an example). A weak bond strength created under these circumstances induces NBTI effect easily, which further affects the performance of the device substantially. By injecting fluorine ions into the interface layer to form Si—F bonds through aforementioned implant processes, the present invention is able to utilize the Si—F bond created to boost up the bond strength between material layers to about 5.73 eV, thereby increasing stability between the material layers and ultimately improving side effects caused by NBTI.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   providing a substrate;
   forming a stack structure on the substrate, wherein the stack structure comprises an interfacial layer;
   performing a second implantation process to implant fluorine ions into the stack structure for forming a first interface layer between the substrate and the interfacial layer after forming the interfacial layer;
   forming a gate structure on the substrate;
   forming a lightly doped drain in the substrate; and
   performing a first implantation process for implanting fluorine ions at a tilted angle into the first interface layer after forming the lightly doped drain.

2. The method of claim 1, further comprising:
   forming the stack structure on the substrate, wherein the stack structure comprises the interfacial layer on the substrate and a sacrificial layer on the interfacial layer;
   performing the second implantation process to implant fluorine ions into the stack structure for forming the first interface layer between the substrate and the interfacial layer;
   patterning the stack structure for forming the gate structure;
   forming the lightly doped drain in the substrate; and
   performing the first implantation process for implanting fluorine ions at a tilted angle into the substrate and the first interface layer.

3. The method of claim 2, wherein the sacrificial layer comprises amorphous silicon or polysilicon.

4. The method of claim 2, wherein the first interface layer comprise SiF.

5. The method of claim 2, further comprising performing the first implantation process for forming a first region and a second region surrounding the first region in the first interface layer.

6. The method of claim 5, wherein the concentration of the second region is higher than the concentration of the first region.

7. The method of claim 1, wherein the step for forming the gate structure comprises:
   forming the stack structure on the substrate, wherein the stack structure comprises the interfacial layer on the substrate, a high-k dielectric layer on the interfacial layer, a bottom barrier metal (BBM) layer on the high-k dielectric layer, and a sacrificial layer on the BBM layer;
   performing the second implantation process to implant fluorine ions into the stack structure for forming the first interface layer between the substrate and the interfacial layer and a second interface layer between the interfacial layer and the high-k dielectric layer;
   patterning the stack structure for forming the gate structure;
   forming the lightly doped drain in the substrate; and
   performing the first implantation process for implanting fluorine ions at a tilted angle into the substrate, the first interface layer, and the second interface layer.

8. The method of claim 7, wherein the sacrificial layer comprises amorphous silicon or polysilicon.

9. The method of claim 7, wherein the BBM layer comprise TiN.

10. The method of claim 7, wherein the first interface layer and the second interface layer comprise SiF.

11. The method of claim 7, further comprising performing the first implantation process for forming a first region and a second region surrounding the first region in each of the first interface layer and the second interface layer.

12. The method of claim 11, wherein the concentration of the second region is higher than the concentration of the first region.

13. The method of claim 1, further comprising:
   forming a spacer on the sidewall of the gate structure after performing the first implantation process;
   forming a source/drain region in the substrate adjacent to the spacer;
   forming a contact etch stop layer on the gate structure;
   forming an interlayer dielectric layer (ILD) on the contact etch stop layer; and
   performing a replacement metal gate (RMG) process to form the gate structure into a metal gate.

* * * * *